United States Patent
Loscutoff et al.

(10) Patent No.: US 10,096,728 B2
(45) Date of Patent: Oct. 9, 2018

(54) FIRING METAL FOR SOLAR CELLS

(71) Applicant: SUNPOWER CORPORATION, San Jose, CA (US)

(72) Inventors: Paul Loscutoff, Castro Valley, CA (US); Taeseok Kim, San Jose, CA (US); Michael Morse, San Jose, CA (US); Peter John Cousins, Los Altos, CA (US); Kevin Mikio Mukai, Richmond, CA (US)

(73) Assignee: SunPower Corporation, San Jose, CA (US)

( * ) Notice: Subject to any disclaimer, the term of this patent is extended or adjusted under 35 U.S.C. 154(b) by 392 days.

(21) Appl. No.: 14/318,100

(22) Filed: Jun. 27, 2014

(65) Prior Publication Data
US 2015/0380577 A1    Dec. 31, 2015

(51) Int. Cl.
| | | |
|---|---|---|
| H01L 31/0224 | (2006.01) | |
| H01B 1/22 | (2006.01) | |
| H01L 31/068 | (2012.01) | |
| H01B 1/20 | (2006.01) | |
| H01L 31/0745 | (2012.01) | |

(52) U.S. Cl.
CPC ....... H01L 31/022441 (2013.01); H01B 1/20 (2013.01); H01B 1/22 (2013.01); H01L 31/0682 (2013.01); H01L 31/0745 (2013.01); *Y02E 10/547* (2013.01)

(58) Field of Classification Search
CPC ......... H01L 31/0684; H01L 31/022425; H01L 31/186–31/1872
See application file for complete search history.

(56) References Cited

U.S. PATENT DOCUMENTS

| | | | | |
|---|---|---|---|---|
| 2007/0107773 A1* | 5/2007 | Fork | ............... | H01L 31/022425 136/256 |
| 2009/0235980 A1* | 9/2009 | Nishida | ............. | H01L 31/02167 136/256 |
| 2010/0084009 A1* | 4/2010 | Carlson | ................. | H01L 31/062 136/255 |
| 2011/0065231 A1* | 3/2011 | Metz | ...................... | H01L 21/268 438/98 |
| 2011/0155244 A1* | 6/2011 | Suh | ................. | H01L 31/022425 136/261 |
| 2012/0318559 A1* | 12/2012 | Aoyagi | .................... | H01B 1/22 174/126.2 |
| 2013/0164887 A1* | 6/2013 | Lee | ........................ | H01L 31/068 438/98 |
| 2014/0084223 A1* | 3/2014 | Guo | ........................ | H01B 1/22 252/514 |
| 2014/0287583 A1* | 9/2014 | Liu | .......................... | H01B 1/22 438/660 |

* cited by examiner

*Primary Examiner* — Eric R Smith

(74) *Attorney, Agent, or Firm* — Schwabe, Williamson & Wyatt, P.C.

(57) ABSTRACT

A solar cell can include a substrate and a semiconductor region disposed in or above the substrate. Selective firing of a conductive paste can be used to form a conductive contact for a solar cell. The solar cell can also include a conductive contact disposed on the semiconductor region with the conductive contact including a conductive paste that has a top and bottom portion with the top portion having particles coalesced together.

18 Claims, 5 Drawing Sheets

FIRING METAL FOR SOLAR CELLS

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
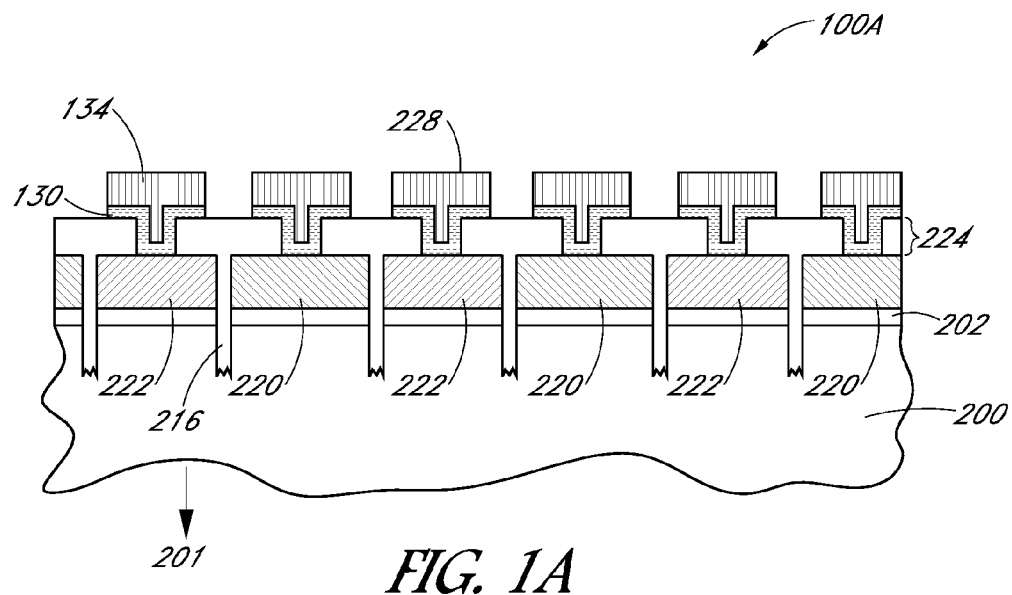
FIG. 1A illustrates a cross-sectional view of a portion of an example solar cell having conductive contacts formed on emitter regions formed above a substrate, according to one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive portion of a solar cell does not necessarily imply that this conductive portion is the first conductive portion in a sequence; instead the term "first" is used to differentiate this conductive portion from another conductive portion (e.g., a "second" conductive portion).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells for ease of understanding, the disclosed techniques and structures apply equally to other semiconductor structures (e.g., silicon wafers generally). Additionally, although many of the examples are directed to back contact solar cells, the disclosed structures and techniques can apply equally to other types of solar cells (e.g., front contact solar cells).

Solar cell conductive contacts and methods of forming solar cell conductive contacts are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

This specification first describes an example solar cell that may include the disclosed conductive contacts, followed by a more detailed explanation of various embodiments of conductive contact structures. Last, the specification includes a description of an example method for forming the disclosed conductive contacts. Various examples are provided throughout.

In a first exemplary solar cell, a seed layer is used to fabricate contacts, such as back-side contacts, for a solar cell having emitter regions formed above a substrate of the solar cell. For example, FIG. 1A illustrates a cross-sectional view of a portion of a solar cell having conductive contacts formed on emitter regions formed above a substrate, in accordance with an embodiment of the present disclosure.

Referring to FIG. 1A, a portion of solar cell 100A includes patterned dielectric layer 224 disposed above a plurality of n-type doped polysilicon regions 220, a plurality of p-type doped polysilicon regions 222, and on portions of substrate 200 exposed by trenches 216. In an embodiment, substrate 200 is a bulk monocrystalline silicon substrate, such as an n-type doped monocrystalline silicon substrate. However, in an alternative embodiment, substrate 200 includes a polycrystalline silicon layer disposed on a global solar cell substrate.

In various embodiments, trenches 216 can be formed between n-type doped polysilicon regions 220 and p-type doped polysilicon regions 222. In one embodiment, portions of trenches 216 can be texturized to have textured features 218.

Dielectric layer 224 can be formed above the plurality of n-type doped polysilicon regions 220, the plurality of p-type doped polysilicon regions 222, and the portions of substrate 200 exposed by trenches 216. In one embodiment, a lower surface of dielectric layer 224 can be formed conformal with the plurality of n-type doped polysilicon regions 220, the plurality of p-type doped polysilicon regions 222, and the exposed portions of substrate 200, while an upper surface of dielectric layer 224 is substantially flat. In a specific embodiment, the dielectric layer 224 is an anti-reflective coating (ARC) layer.

In various embodiments, a plurality of contact openings 226 is formed in dielectric layer 224. The plurality of contact openings 226 provides exposure to the plurality of n-type doped polysilicon regions 220 and to the plurality of p-type doped polysilicon regions 222. In one embodiment, the plurality of contact openings 226 is formed by laser ablation. In one embodiment, the contact openings 226 to the n-type doped polysilicon regions 220 have substantially the same height as the contact openings to the p-type doped polysilicon regions 222.

In some embodiments, conductive contacts 228 are disposed in a plurality of contact openings disposed in dielectric layer 224 and are coupled to the plurality of n-type doped polysilicon regions 220 and to the plurality of p-type doped polysilicon regions 222.

Furthermore, the plurality of n-type doped polysilicon regions 220 and the plurality of p-type doped polysilicon regions 222 can, in one embodiment, provide emitter regions for solar cell 100A. Thus, in an embodiment, conductive contacts 228 are disposed on the emitter regions. In an embodiment, conductive contacts 228 are back contacts for a back-contact solar cell and are situated on a surface of the solar cell opposing a light receiving surface (direction provided as 201 in FIG. 1A) of solar cell 100A. Furthermore, in one embodiment, the emitter regions are formed on a thin or tunnel dielectric layer 202. In one embodiment, thin dielectric layer 202 is composed of silicon dioxide and has a thickness approximately in the range of 5-50 Angstroms. In one embodiment, thin dielectric layer 202 performs as a tunnel oxide layer.

Still referring to FIG. 1A, each of conductive contacts 228 can include conductive paste 130 and another conductive material, such as conductive region 134. In one embodiment, conductive paste 130 can be a metal paste (e.g., aluminum, nickel, silver, alloys of metals, such as aluminum, among other examples) or a non-metal conductive paste (e.g., conductive carbon). In various embodiments, the conductive paste can include a matrix binder having aluminum-containing particles (or other metal-containing particles) dispersed therein. In one embodiment, the conductive paste includes aluminum/silicon (Al/Si) particles. As noted above, examples of conductive paste include aluminum, aluminum-silicon alloy, tin, conductive carbon, etc. In various embodiments, the printed paste can have a thickness of approximately 1-10 microns (although note that the thickness may not be equal or uniform throughout the paste). The paste can include a solvent for ease of delivery of the paste and can also include other elements, such as binders or frit.

To provide context, printed paste can be used as a low cost seed for subsequent metal plating operations for solar cell metallization. For example, the paste can be printed in a pattern (e.g., a pre-determined pattern consistent with the fingers or contact regions for the solar cell) such that the paste does not have to subsequently be masked and etched to form the pattern. Accordingly, printed seed paste can provide a higher throughput lower cost technique than sputtered seed.

Printed conductive paste (e.g., metal paste, conductive carbon paste, etc.) can include conductive particles, which upon being fired, create electrical contact to the silicon surface and create electrical contact among the conductive particles. Melting the conductive particles can create a dense film with contact to the substrate but the melting can also damage the actual substrate. If the conductive particles do not melt, it can be difficult to create a low specific contact resistance connection to the substrate and a low sheet resistance within the conductive particle film. These resistances can contribute to the solar cell series resistance and therefore limit the performance of the cell. On the other hand, a more aggressive thorough melt of the particles can cause lifetime issues for the solar cell, for example, from pitting or spiking of the substrate. As described herein, the disclosed structures and techniques can improve the electrical properties of the conductive contact of a solar cell yet reduce the risk of substrate damage.

Conductive paste 130 can also be referred to as a seed layer and can be in contact with the emitter regions of the solar cell 100A. Cross-sectional views of conductive paste particles in example solar cells are illustrated in more detail in FIGS. 2A-2B, 3A-3B, and 4A-4B.

The metal particles of the paste can be coalesced to varying degrees resulting in a conductive region or portion of the paste, according to various embodiments. In various embodiments, the coalescence can vary vertically (depth-z axis toward the substrate) or spatially (x-y across the area of the paste) within the paste. For example, a surface melt fire can result in particles from the top portion of the conductive paste being coalesced more than particles from a bottom portion of the conductive paste. In a full melt fire, particles from top and bottom portions can be substantially coalesced. Substantially coalesced can be defined in terms of a density or porosity or sheet and/or specific contact resistance for the conductive contact. In some embodiments, the varying degrees of coalescence can be achieved by selectively firing the paste relative to the substrate. Such selective firing includes laser photon or electron beam firing, inductive or resistive heating, rapid thermal processing ("RTP"), among other examples.

In one embodiment, the specific contact resistance of the conductive contact is less than or equal to 100 mohms*cm$^2$. In some embodiments, the specific contact resistance can be about 1 mohms*cm$^2$, 5 mohms*cm$^2$, or 10 mohms*cm$^2$ among other examples. In one embodiment, the sheet resistance of the conductive contact can be less than or equal to 1 ohms per square.

In some embodiments, conductive region 134 can be disposed on the conductive particles of the conductive paste. Example conductive regions 134 include a conductive foil (e.g., aluminum, copper, alloys, etc.) or a plated metal (e.g., nickel, copper, tin, etc.). In one embodiment, the conductive material 134 can be coupled to the conductive paste at the same time the conductive paste is coupled to the substrate. In other embodiments, the conductive material 134 can be coupled to the conductive paste after the conductive paste is fired and coupled to the substrate.

In some embodiments, regions of conductive paste 130 can be in contact with respective damage buffer regions (not illustrated) that are disposed on the emitter regions of solar cell 100A. Example damage buffer regions include metal-containing regions (e.g., nickel (Ni), titanium (Ti), or tungsten (W), among other examples), tunneling dielectric regions (e.g., thin oxide regions), and/or metal silicide regions (e.g., Ni silicide), polycrystalline or amorphous silicon, among other examples. In some embodiments, the damage buffer can be consumed during fabrication of the solar cell (e.g., during firing) whereas in other embodiments, at least a portion of the damage buffer can remain in the final solar cell.

Figure 1B:
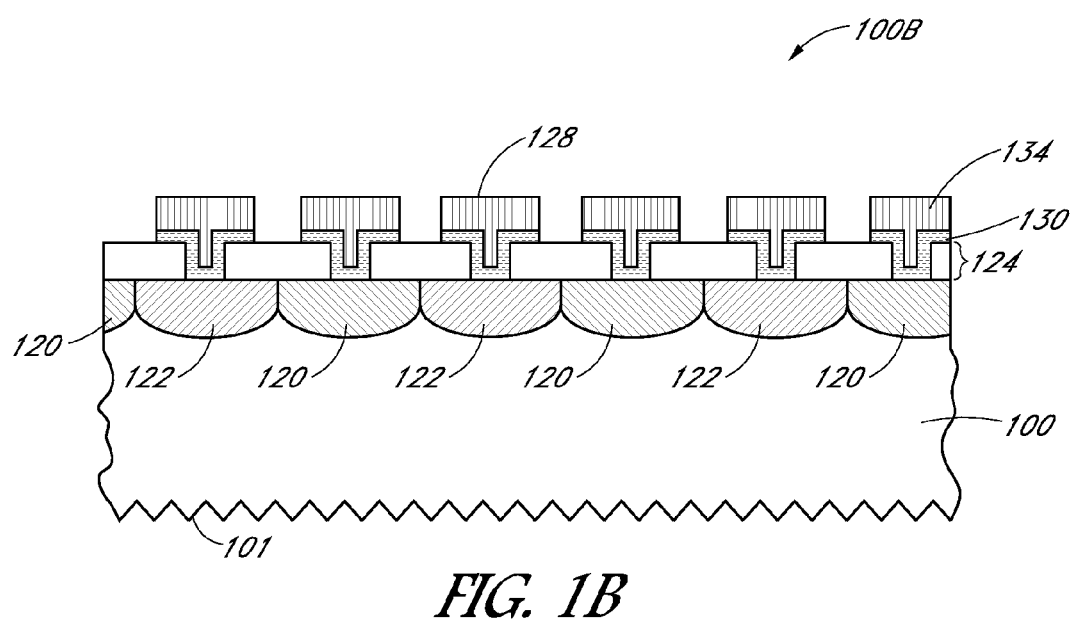
FIG. 1B illustrates a cross-sectional view of a portion of an example solar cell having conductive contacts formed on emitter regions formed in a substrate, according to one embodiment.

Turning now to FIG. 1B, a cross-sectional view of a portion of an example solar cell having conductive contacts formed on emitter regions formed in a substrate is illustrated, according to one embodiment. For example, in this second exemplary cell, a seed layer is used to fabricate contacts, such as back-side contacts, for a solar cell having emitter regions formed in a substrate of the solar cell.

As shown in FIG. 1B, a portion of solar cell 100B includes patterned dielectric layer 124 disposed above a plurality of n-type doped diffusion regions 120, a plurality of p-type doped diffusion regions 122, and on portions of substrate 100, such as a bulk crystalline silicon substrate. Conductive contacts 128 are disposed in a plurality of contact openings disposed in dielectric layer 124 and are coupled to the plurality of n-type doped diffusion regions 120 and to the plurality of p-type doped diffusion regions 122. In an embodiment, diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for solar cell 100B. Thus, in an embodiment, conductive contacts 128 are disposed on the emitter regions. In an embodiment, conductive contacts 128 are back contacts for a back-contact solar cell and are situated on a surface of the solar cell opposing a light receiving surface, such as opposing a texturized light receiving surface 101, as depicted in FIG. 1B.

In one embodiment, referring again to FIG. 1B, conductive contacts 128 can include conductive paste 130 and another conductive region, such as conductive region 134. The description of the conductive contacts, conductive paste, other conductive region, and damage buffer at FIG. 1A applies equally to FIG. 1B unless otherwise noted.

Although certain materials are described herein, some materials may be readily substituted with others with other such embodiments remaining within the spirit and scope of embodiments of the present disclosure. For example, in an embodiment, a different material substrate, such as a group III-V material substrate, can be used instead of a silicon substrate. As another example, in one embodiment, silver (Ag) particles, carbon (C), tin, or the like can be used in a seed paste in addition to or instead of Al particles.

FIGS. 2A-2B, 3A-3B, and 4A-4B illustrate cross-sectional views of a portion of example conductive contacts, according to one embodiment. For ease and clarity of description, some of the structures in FIGS. 1A and 1B have been omitted from FIGS. 2A-2B, 3A-3B, and 4A-4B and accompanying description.

Figure 2A:
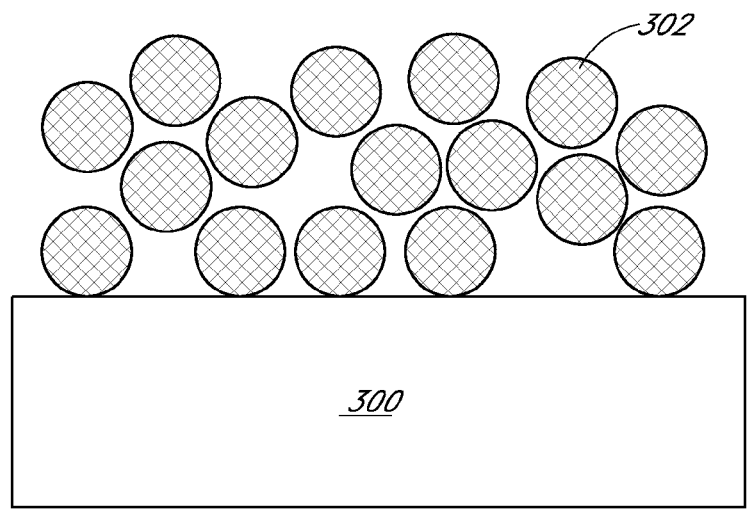
FIGS. 2A and 2B illustrate cross-sectional views of a portion of an example conductive contact, according to one embodiment.
Figure 2B:
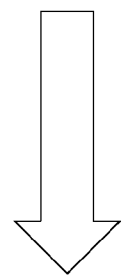
Figure 2B:
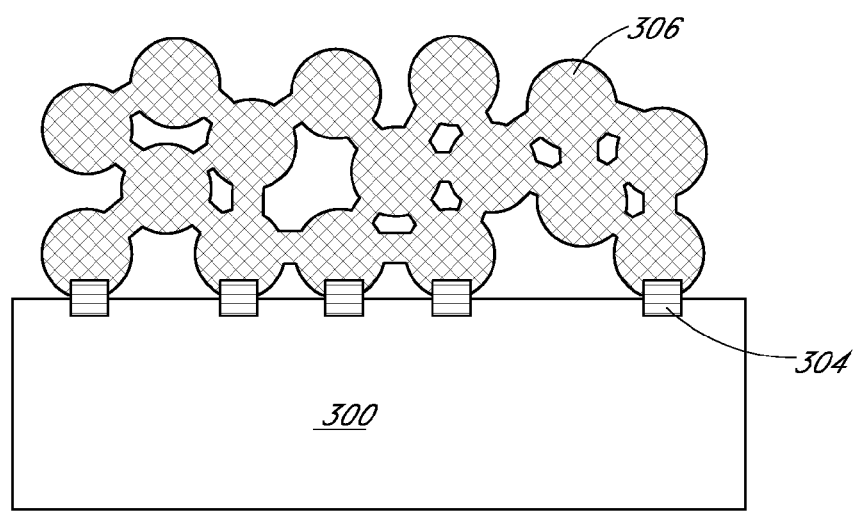

FIG. 2A illustrates particles of conductive paste 302 deposited on substrate 300. FIG. 2B illustrates alloyed portions 304 between the substrate and conductive paste that can result from firing the conductive paste, with the firing being represented by the arrow between FIGS. 2A and 2B. FIG. 2B additionally shows various particles of conductive paste 302 at least partially melted/coalesced together as shown in partially coalesced paste 306, which can provide greater continuity among the various conductive particles and from the conductive particles to the substrate. In one embodiment, the partially coalesced paste 306 is the result of a firing procedure such as annealing the wafer and paste in a furnace, such as a belt or tube furnace.

Figure 3A:
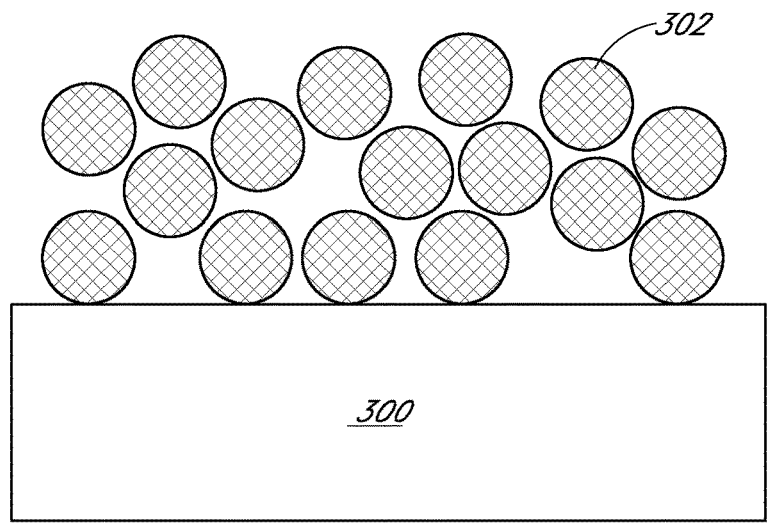
FIGS. 3A and 3B illustrate cross-sectional views of a portion of an example conductive contact, according to one embodiment.
Figure 3B:
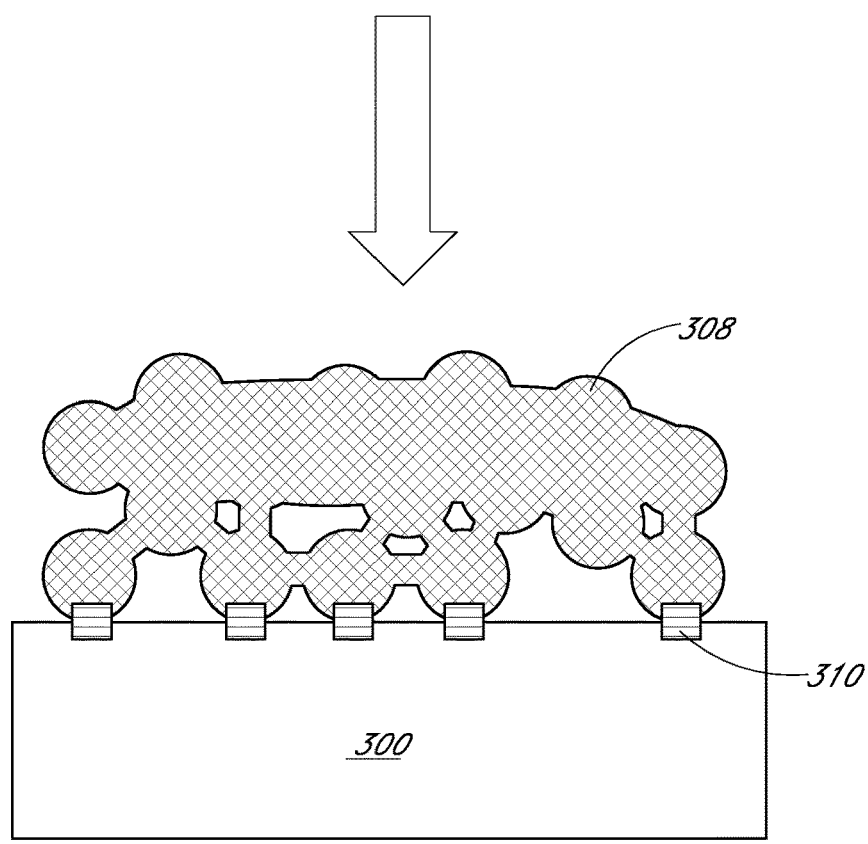

Turning now to FIG. 3A, particles of conductive paste 302 are illustrated as deposited on substrate 300. FIG. 3B illustrates alloyed portions 310 between the substrate and conductive paste that can result from firing the conductive paste, with the firing being represented by the arrow between FIGS. 3A and 3B. As noted above regarding FIG. 2B, the amount of alloying can vary according to the composition of the paste, the substrate composition (e.g., silicon), and the firing technique (e.g., temperature, duration, laser, RTP, inductive or resistive heating, etc.), among other variables. FIG. 3B additionally shows various particles of conductive paste 302 at least partially melted together as shown in partially coalesced paste 308, which can provide greater continuity among the various conductive particles and from the conductive particles to the substrate. As compared to FIG. 2B, the amount of coalescing of the particles of the paste in FIG. 3B is greater with the top portion of partially coalesced paste 308 being more coalesced than the bottom portion of the partially coalesced paste. A coalesced, or melted top portion, can also be referred to as a surface melt and can be formed according to various techniques, such as laser, inductive or resistive heating, RTP, etc., as described herein. As illustrated, the surface melted paste includes a top portion of the paste that is more coalesced than the bottom portion.

Figure 4A:
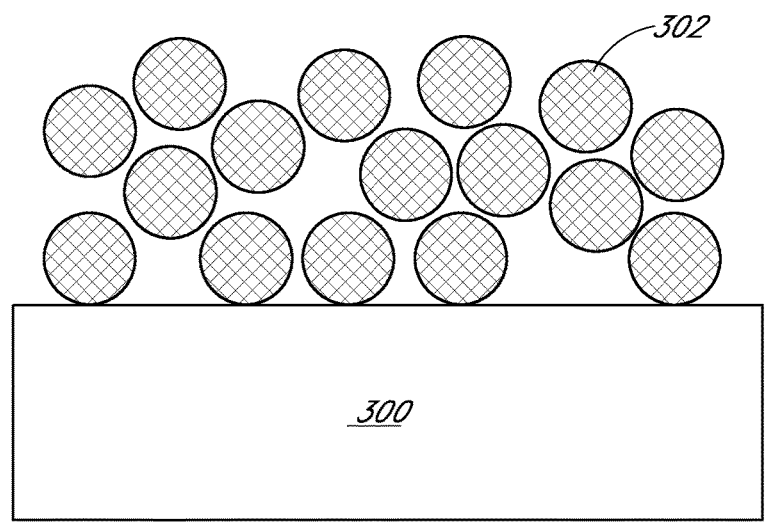
FIGS. 4A and 4B illustrate cross-sectional views of a portion of an example conductive contact, according to one embodiment.
Figure 4B:
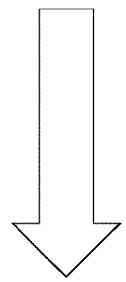
Figure 4B:
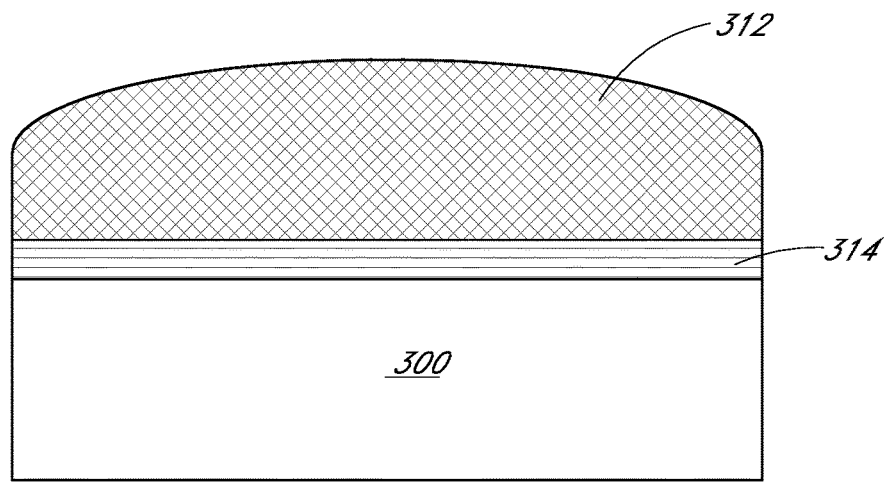

FIG. 4A illustrates particles of conductive paste 302 deposited on substrate 300 as in FIGS. 2A and 3A. FIG. 4B illustrates alloyed portions 314 between the substrate and conductive paste that can result from firing the conductive paste, with the firing being represented by the arrow between FIGS. 4A and 4B. As noted above regarding FIG. 4B, the amount of alloying can vary according to the composition of the paste, the substrate composition (e.g., silicon), and the firing technique (e.g., temperature, duration, laser, RTP, inductive or resistive heating, etc.), among other variables. FIG. 4B additionally shows various particles of conductive paste 302 melted together as shown in coalesced paste 312, which can provide greater continuity among the various conductive particles and from the conductive particles to the substrate. As compared to FIGS. 2B and 3B, the amount of coalescing of the particles of the paste in FIG. 4B is greater. The coalesced particles of FIG. 4B can be referred to as fully melted particles. Fully melted is used herein to describe coalesced particles that have a substantially uniform coalescence throughout the surface (x-y) and depth (z) of the paste. The full melt can be formed according to various techniques, such as laser, inductive or resistive heating, RTP, etc., as described herein. In addition to the more substantial coalescence in the example of FIG. 4B, note also the increased amount of alloyed portions 314 as compared to the examples of FIGS. 2B and 3B.

In various embodiments, the surface melt and full melt examples of FIGS. 3B and 4B, respectively, can be achieved through the disclosed firing techniques, which allow for tighter control (e.g., temperature, spatial, depth, etc.) for the firing process, which can target heating of the paste without excessive heating of the substrate. The resulting surface melt and full melt structures can improve the overall structural integrity of the conductive contact as well as lower sheet and/or specific contact resistance while reducing the likelihood of pitting or other damage to the substrate. Accordingly, the resulting solar cell can have improved reliability and lifetime as a result of the improved contact.

Figure 5:
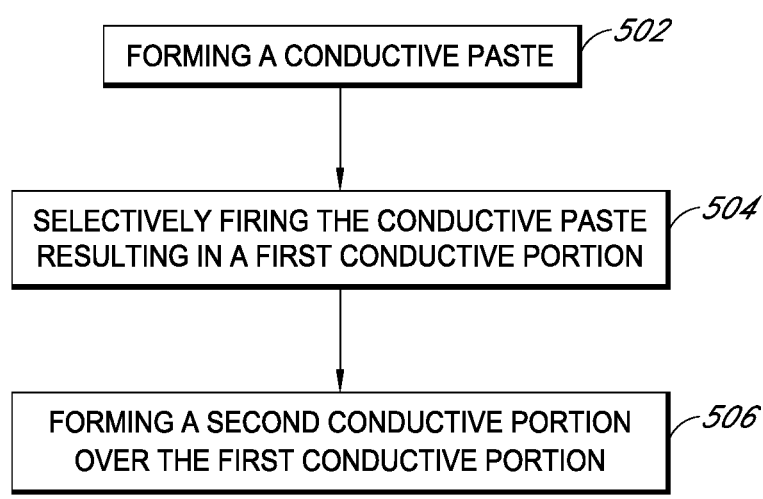
FIG. 5 is a flowchart illustrating an example method of forming a conductive contact, according to one embodiment.

Turning now to FIG. 5, a flow chart illustrating a method for forming a conductive contact is shown, according to some embodiments. In various embodiments, the method of FIG. 5 may include additional (or fewer) blocks than illustrated. For example, in some embodiments, a damage buffer region can be formed before forming the conductive paste at block 502. In another example, forming the second conductive portion over the first conductive portion at block 506 may not be performed in some embodiments.

As shown at 502, a conductive paste can be formed. In one embodiment, the conductive paste can be formed by screen printing. Forming the paste can include printing the paste in a pattern that is suitable for connectivity with respective p and n regions of a solar cell (e.g., in a finger pattern). In one embodiment, the paste is formed from a mixture that includes conductive particles (e.g., metal particles), a liquid binder, and an inert filler material (e.g., frit material).

At 504, in some embodiments, the conductive paste can be fired. In one embodiment, the firing can be a selective firing that allows for tighter control over the firing process than an in a conventional furnace anneal process that heats the paste and substrate equally. For example, heat can be applied directly to the paste with only residual heat reaching the substrate. Accordingly, the firing techniques described herein can heat at least a portion of the paste to a first, higher temperature, and the substrate to a second, lower temperature. Firing the conductive paste can form a conductive portion from coalesced particles of the paste and also electrically couple the paste to the substrate.

In various embodiments, firing the conductive paste can be a surface melt firing or a full melt firing. In one embodiment, a surface melt firing can result in particles of the top portion (e.g., farther from the substrate than the bottom portion) of the conductive paste being more coalesced than the particles of the bottom portion. In one embodiment, a full melt firing can result in the particles of the conductive paste being coalesced to the substrate without a significant difference between the coalescence of particles in the top portion versus the bottom portion of the paste. In some embodiments, the firing can be spatially controlled such that the degree of coalescence is different for paste particles at one x-y location of the paste compared to another location.

Surface melt and/or full melt firing can be performed according to a variety of techniques, such as an energetic beam technique (e.g., laser beam, electron beam), inductive or resistive heating, or RTP. In one embodiment, parameters of a particular technique can be selected to control whether a surface melt, full melt, or other melt is performed. For example, in a laser heating firing technique, the laser pulses can be closer together spatially or longer in duration to perform a more complete melt. Conversely, for a surface melt, greater spatial distance or less power, among other parameter selections can be used.

In one embodiment, the parameters of the various firing techniques can also be dependent on the type of conductive paste (e.g., aluminum versus silver, etc.) and the type of substrate (e.g., n-type doped silicon, non-silicon, etc.).

In various embodiments, firing the conductive paste can be applied selectively in multiple locations of the conductive paste, which can help enable the surface melt or full melt techniques without risking significant damage to the substrate. In such embodiments, the firing can be controlled spatially. Similarly, in some embodiments, firing the conductive paste can be applied in a depth-controlled manner such that firing is applied selectively to a depth of the conductive paste that is less than the full thickness of the conductive paste.

In one embodiment, firing the conductive paste includes applying a high energy beam technique. Example high energy beams include electron beams and laser photon beams. In one embodiment, the high energy beam can be used to anneal, heat, or sinter portions of the paste.

In various embodiments, the laser parameters can be configured dependent on whether a surface melt or full melt is performed. The laser can be on the order of a microsecond or nanosecond laser such that it does not ablate the paste. In various embodiments, the high energy beam can be pulsed or can be continuous, dependent on the type of melt being performed. In one embodiment, the laser parameters used for firing the paste can be similar to those for performing a weld (e.g., of a foil to the conductive paste, or one cell to another, etc.). In some embodiments, firing the paste and welding of a foil to the paste can be performed in a single step.

The short time scale in some laser firing embodiments can allow for highly localized heating such that effective melting can occur while reducing the interaction with the substrate surface. Laser firing can have enough lateral precision such that only the areas of the wafer that have been printed with paste are fired as opposed to an oven firing where the paste and substrate are heated equally.

In one embodiment, firing the conductive paste can include applying a resistive/Joule or inductive heating technique to the conductive paste. In one embodiment, resistive heating can selectively heat the printed paste by passing current through the paste until the heat generated by resistive losses is sufficient to fully melt or partially melt the particles together. The current and heating can be confined to the paste pattern because it is the electrical path of least resistance (the resistance of passing current through the substrate is sufficiently high to prevent a significant amount of current flow through the substrate). In one embodiment, the timescale for this type of electrical heating is based off the ability to cycle the power supply, and in some embodiments, is on the order of 1 MHz. In one embodiment, the electrodes from the resistive heating can be configured such that a connection is made at the base and tip of the fingers (e.g., each finger) so that current is passed through the metal and not through the substrate.

The frequency of a resistive or inductive heating technique can be adjusted depending on the degree of selectivity of firing that is to be used. For example, a higher frequency (and shorter) pulse can result in a finer degree of firing selectivity.

In one embodiment, an electrode can be used to measure the resistivity of the conductive paste. The resistive heating firing technique can be applied until a resistivity threshold is met.

In one embodiment, firing the conductive paste can include applying an RTP technique. RTP can selectively melt the printed paste by utilizing the higher absorption coefficient of paste than the absorption coefficient of the substrate. This effect can be enhanced by filtering the heating lamp to IR frequencies where the absorption coefficient of silicon drops off rapidly. The heating lamp can be constantly on for a certain period of time, or it can be flashed (pulsed) to control the degree of melting.

In various embodiments, firing the conductive paste can be applied selectively in multiple locations of the conductive paste. For example, as described herein, the firing can be controlled spatially. Spatial control is used herein to describe control across the area (x and y) of the paste. Similarly, in some embodiments, firing the conductive paste can be applied in a depth-controlled manner such that firing is applied selectively to a depth of the conductive paste that is less than a height of the conductive paste, as defined by the z-axis toward the substrate. As examples of spatial and depth control using a laser firing technique, the laser power can be controlled in a manner than controls the depth to which the laser firing is performed. Similarly, the shape of the laser beam and where the laser is scanned can be defined to spatially control the firing. Along the same lines, in a resistive heating firing embodiment, the placement of the electrodes and the current applied can be controlled to spatially control the firing. Other spatial and depth control examples exist.

At 506, another conductive portion can be formed over the conductive portion that results from firing the conductive paste. In one embodiment, the other conductive portion can be a plated metal. Examples for forming the plated metal include electroplating copper, electrolessly plating nickel, among other examples of plating metal.

In one embodiment, the other conductive portion can be a conductive foil. For example, an aluminum foil, or other conductive-material-containing foil, can be electrically coupled to the conductive portion. In one embodiment, the conductive foil can be coupled to the conductive portion at the same time the conductive paste is fired. As one example, in a laser firing technique, the conductive foil can be placed over the conductive paste before the paste is fired. The conductive foil can then be welded to the paste at the same time the paste is laser fired. The weld can be done with the same laser (same parameters and same time) as the firing laser or it can be done in a single tool but with different lasers or different laser parameters or it can be done in a separate tool. By performing the firing after the conductive foil is placed on the paste, greater control and selectivity in the firing can be achieved due to the greater overall thickness of the material (the thickness of the paste plus the thickness of the foil).

In one embodiment, a damage buffer can be formed over the silicon substrate before forming the conductive paste such that the damage buffer is disposed between the substrate and regions of the conductive paste. For example, in one embodiment, the damage buffer can be a sacrificial polycrystalline or amorphous silicon region formed over the silicon substrate (and over the tunnel dielectric layer). In other embodiments, other damage buffers can be used such as metal-containing regions (e.g., nickel (Ni), titanium (Ti), or tungsten (W), among other examples), tunneling dielectric regions (e.g., thin oxide regions), and/or metal silicide regions (e.g., Ni silicide), among other examples. Use of a damage buffer can protect the substrate and/or tunnel dielectric from damage (e.g., silicon pitting) during the firing and/or other processing. The protection can enable a more aggressive firing technique, such as those described herein, by providing a buffer between the paste and substrate thereby lessening the risk of pitting or spiking In some embodiments, the damage buffer can be consumed during firing or subsequent processing steps whereas in other embodiments, at least some of the damage buffer is retained in the final resulting solar cell.

The disclosed structures and techniques can improve the electrical properties of conductive contacts. For example, by firing conductive paste according to the disclosed structures and techniques, contact and/or sheet resistance can be decreased and mechanical stability (e.g., adhesion of the paste to the substrate) can be improved. Moreover, the ability to selectively heat the paste without heating the substrate to a similar degree can increase the thermal budget for firing and can also enable spatial and vertical control firing. By providing a more uniform melt of the paste while reducing risk of substrate pitting, a denser conductive film (less porous) is created, which can also reduce the risk of etch chemistry from penetrating pores in the paste.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a conductive paste on a silicon substrate, the conductive paste having a first portion above a second portion above the substrate; and
    selectively firing the conductive paste to form a conductive material and to electrically couple the conductive paste to the silicon substrate, wherein said selectively firing the conductive paste includes coalescing the first portion of the conductive paste more than the second portion of the conductive paste, wherein the second portion is above the silicon substrate, wherein the first portion is above the second portion, wherein the second portion is continuous with and has a same composition as the first portion, and wherein the second portion is less dense than the first portion, and wherein said firing is applied to a first depth of the conductive paste that is less than a full depth of the conductive paste.

2. The method of claim 1, further comprising forming a damage buffer over the silicon substrate, wherein said forming the conductive paste includes forming the conductive paste on the damage buffer.

3. The method of claim 1, wherein said firing the paste includes applying a high energy beam to the conductive paste.

4. The method of claim 3, wherein said applying the high energy beam includes applying a laser beam to the conductive paste.

5. The method of claim 1, wherein said firing includes applying a resistive or inductive heating technique to the conductive paste.

6. The method of claim 1, wherein said firing includes applying a rapid thermal processing technique to the conductive paste.

7. The method of claim 1, wherein said forming the conductive paste includes printing the conductive paste.

8. The method of claim 1, further comprising forming a third conductive portion over the conductive material.

9. The method of claim 1, wherein said forming the conductive paste includes forming the conductive paste on a back side of the solar cell, wherein the back side is opposite a light receiving side of the solar cell.

10. The method of claim 1, wherein said firing is applied separately in first and second locations of the conductive paste.

11. The method of claim 1, wherein said forming the paste includes printing particles that include aluminum.

12. A method of fabricating a solar cell, the method comprising:
    forming an aluminum and silicon paste on a silicon substrate, the aluminum and silicon paste having a first portion above a second portion above the substrate; and
    selectively firing the aluminum and silicon paste to form a conductive material and to electrically couple the aluminum and silicon paste to the silicon substrate, wherein said selectively firing the aluminum and silicon paste includes coalescing the first portion of the aluminum and silicon paste more than the second portion of the aluminum and silicon paste, wherein the second portion is above the silicon substrate, wherein the first portion is above the second portion, wherein the second portion is continuous with and has a same composition as the first portion, and wherein the second portion is less dense than the first portion, and wherein said firing is applied to a first depth of the aluminum and silicon paste that is less than a full depth of the aluminum and silicon paste.

13. The method of claim 12, further comprising forming a damage buffer over the silicon substrate, wherein said forming the aluminum and silicon paste includes forming the aluminum and silicon paste on the damage buffer.

14. The method of claim 13, further comprising forming a third conductive portion over the conductive material.

15. The method of claim 12, wherein said firing the paste includes applying a high energy beam to the aluminum and silicon paste.

16. The method of claim 15, wherein said applying the high energy beam includes applying a laser beam to the aluminum and silicon paste.

17. The method of claim 15, wherein said forming the aluminum and silicon paste includes printing the aluminum and silicon paste.

18. The method of claim 12, wherein said firing is applied separately in first and second locations of the aluminum and silicon paste.

* * * * *